United States Patent
Harada

(10) Patent No.: US 9,685,971 B2
(45) Date of Patent: Jun. 20, 2017

(54) SUCCESSIVE COMPARISON A/D CONVERSION CIRCUIT

(71) Applicant: OLYMPUS CORPORATION, Hachioji-shi, Tokyo (JP)

(72) Inventor: Yasunari Harada, Ebina (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/299,660

(22) Filed: Oct. 21, 2016

(65) Prior Publication Data

US 2017/0041016 A1   Feb. 9, 2017

Related U.S. Application Data

(63) Continuation of application No. PCT/JP2015/057480, filed on Mar. 13, 2015.

(30) Foreign Application Priority Data

May 8, 2014   (JP) ................. 2014-096818

(51) Int. Cl.
*H03M 1/38* (2006.01)
*G11C 27/02* (2006.01)
*H03M 1/12* (2006.01)

(52) U.S. Cl.
CPC ............ *H03M 1/38* (2013.01); *G11C 27/024* (2013.01); *H03M 1/1245* (2013.01)

(58) Field of Classification Search
CPC ................. H03M 1/1245; G11C 27/024

(Continued)

(56) References Cited

U.S. PATENT DOCUMENTS 5,061,926 A * 10/1991 Washiyama ........ H03M 1/1215
                                                                341/122
5,144,310 A *  9/1992 Sato ...................... H03M 1/46
                                                                341/158

(Continued)

FOREIGN PATENT DOCUMENTS

JP         2011-120011 A       6/2011

OTHER PUBLICATIONS

Harpe et al., "A 26 μW 8 bit 10 MS/s Asynchronous SAR ADC for Low Energy Radios", IEEE Journal of Solid-State Circuits, (Jul. 2011), No. 7, vol. 46, pp. 1585-1595. (11 pages).

(Continued)

*Primary Examiner* — Lam T Mai
(74) *Attorney, Agent, or Firm* — Westerman, Hattori, Daniels & Adrian, LLP

(57) ABSTRACT

A successive comparison A/D conversion circuit includes: an comparison circuit including a differential amplification circuit which includes a pair of differential input terminals, amplifies a pair of first differential signals input into the pair of differential input terminals, and outputs a pair of second differential signals, and a latch circuit which compares voltages of the second differential signals output from the differential amplification circuit, retains an comparison result, and outputs the retained comparison result; a digital circuit which generates a digital signal corresponding to the first differential signal, based on the comparison result; an arithmetic circuit which generates a reference signal based on the digital signal, generates the first differential signal by subtracting the reference signal from a third differential signal or adding the reference signal to the third differential signal, and outputs the generated first differential signal to the pair of differential input terminals; and a control circuit.

3 Claims, 10 Drawing Sheets

(58) Field of Classification Search
USPC .................................................. 341/140–165
See application file for complete search history.

(56) References Cited

U.S. PATENT DOCUMENTS

| | | | | |
|---|---|---|---|---|
| 6,163,291 | A * | 12/2000 | Uchino | H03M 1/06 341/155 |
| 6,452,528 | B1 * | 9/2002 | Mansoorian | H03M 1/46 341/155 |
| 6,809,674 | B1 * | 10/2004 | Ramsden | H03M 1/1225 341/141 |
| 7,030,802 | B2 * | 4/2006 | Kawata | H03M 1/46 341/155 |
| 9,369,137 | B2 * | 6/2016 | Masuko | H03L 7/0818 |
| 2011/0057823 | A1 | 3/2011 | Harpe | |
| 2011/0133971 | A1 | 6/2011 | Ogawa et al. | |
| 2011/0315879 | A1 | 12/2011 | Chalk et al. | |
| 2014/0333459 | A1 * | 11/2014 | Oshima | H03M 1/1033 341/120 |
| 2014/0362273 | A1 * | 12/2014 | Okura | H04N 5/37455 348/308 |
| 2015/0213905 | A1 * | 7/2015 | Matsuno | G11C 27/02 341/122 |
| 2016/0126962 | A1 * | 5/2016 | Masuko | H03L 7/0818 341/118 |
| 2016/0359463 | A1 * | 12/2016 | Kurose | H03M 1/50 |

OTHER PUBLICATIONS

Giannini et al., "An 820μW 9b 40MS/s Noise-Tolerant Dynamic-SAR ADC in 90nm Digital CMOS", Digest of Technical Papers. ISSCC. (2008), 02, pp. 238-239, 610. (3 pages).

International Search Report dated May 26, 2015, issued in counterpart International Application No. PCT/JP2015/057480 (2 pages).

* cited by examiner

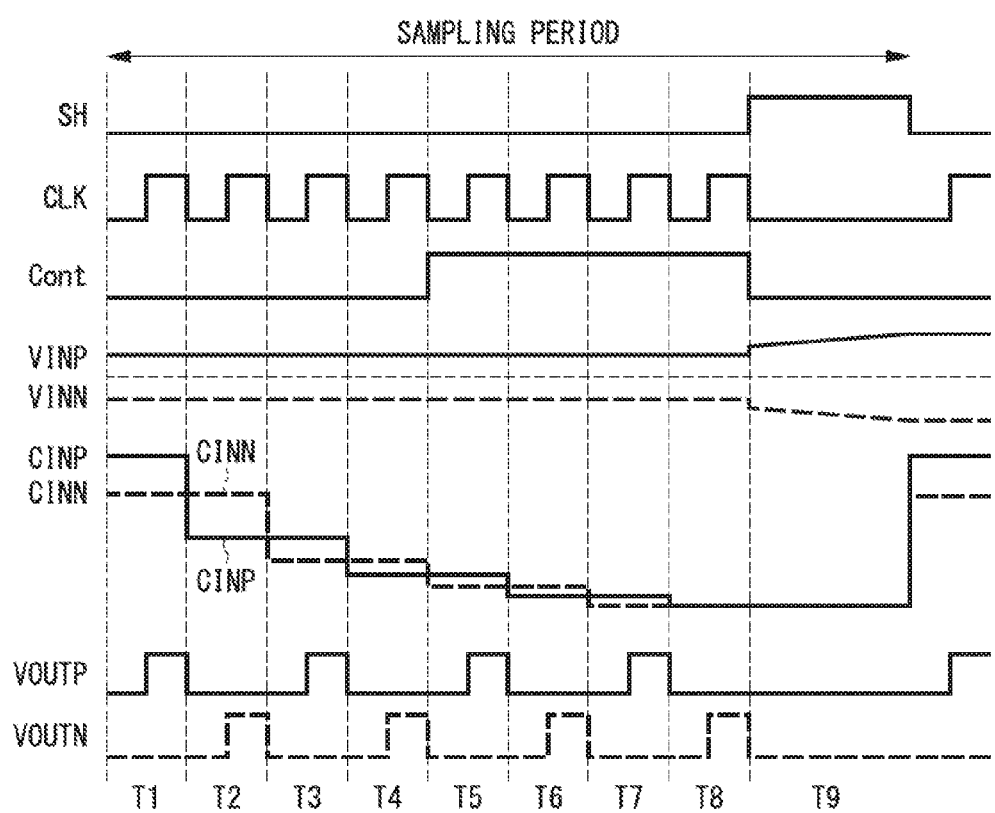

SUCCESSIVE COMPARISON A/D CONVERSION CIRCUIT

CROSS REFERENCE TO RELATED APPLICATIONS

This application is a continuation application based on a PCT International Application No. PCT/JP2015/057480, filed on Mar. 13, 2015, whose priority is claimed on Japanese Patent Application No. 2014-096818, filed on May 8, 2014. Both of the contents of the PCT International Application and the Japanese Application are incorporated herein by reference.

BACKGROUND OF THE INVENTION

Field of the Invention

The present invention relates to a successive comparison A/D conversion circuit.

Description of Related Art

For example, a successive comparison A/D conversion circuit disclosed in "A 26 µW 8 bit 10 MS/s Asynchronous SAR ADC for Low Energy Radios", IEEE JOURNAL SOLID-STATE CIRCUITS, Vol. 46, No. 7 Jul. 2011 pp. 1585-1595 has been known as an A/D conversion circuit having low power consumption. The successive comparison A/D conversion circuit amplifies a pair of differential signals of an A/D conversion target, and compares voltages of the amplified differential signals. In addition, the successive comparison A/D conversion circuit generates a reference signal corresponding to an comparison result, and subtracts the reference signal from the differential signal of the A/D conversion target. The successive comparison A/D conversion circuit amplifies the differential signal obtained by subtraction, and compares the voltages of the amplified differential signals. Hereinafter, the processes described above are repeated.

SUMMARY OF THE INVENTION

According to a first aspect of the present invention, a successive comparison A/D conversion circuit includes an comparison circuit including a differential amplification circuit which includes a pair of differential input terminals, amplifies a pair of first differential signals input into the pair of differential input terminals, and outputs a pair of second differential signals, and a latch circuit which compares voltages of the second differential signals output from the differential amplification circuit, retains an comparison result, and outputs the retained comparison result; a digital circuit which generates a digital signal corresponding to the first differential signal based on the comparison result; an arithmetic circuit which generates a reference signal based on the digital signal, generates the first differential signal by subtracting the reference signal from a third differential signal, or by adding the reference signal to the third differential signal, and outputs the generated first differential signal to the pair of differential input terminals; and a control circuit which stops an operation of the differential amplification circuit in a predetermined period including a period in which the comparison circuit initiates comparison.

According to a second aspect of the present invention, in the successive comparison A/D conversion circuit of the first aspect, the control circuit may stop the operation of the differential amplification circuit in a period in which the number of times of comparison does not satisfy a predetermined number of times of comparison.

According to a third aspect of the present invention, the successive comparison A/D conversion circuit of the first aspect may further include a measurement circuit which measures an offset voltage applied to the second differential signal in the latch circuit based on the comparison result when a predetermined signal is input into the differential input terminal as the first differential signal, and the control circuit may stop the operation of the differential amplification circuit in a predetermined period, which includes a period in which the comparison circuit initiates comparison and is in accordance with the offset voltage measured by the measurement circuit

BRIEF DESCRIPTION OF THE DRAWINGS

FIG. 11 is a timing chart illustrating an operation example of the successive comparison A/D conversion circuit according to the reference aspect of the present invention.

DETAILED DESCRIPTION OF THE INVENTION

Hereinafter, embodiments of the present invention will be described with reference to the drawings.

(Reference Aspect)

Figure 9:
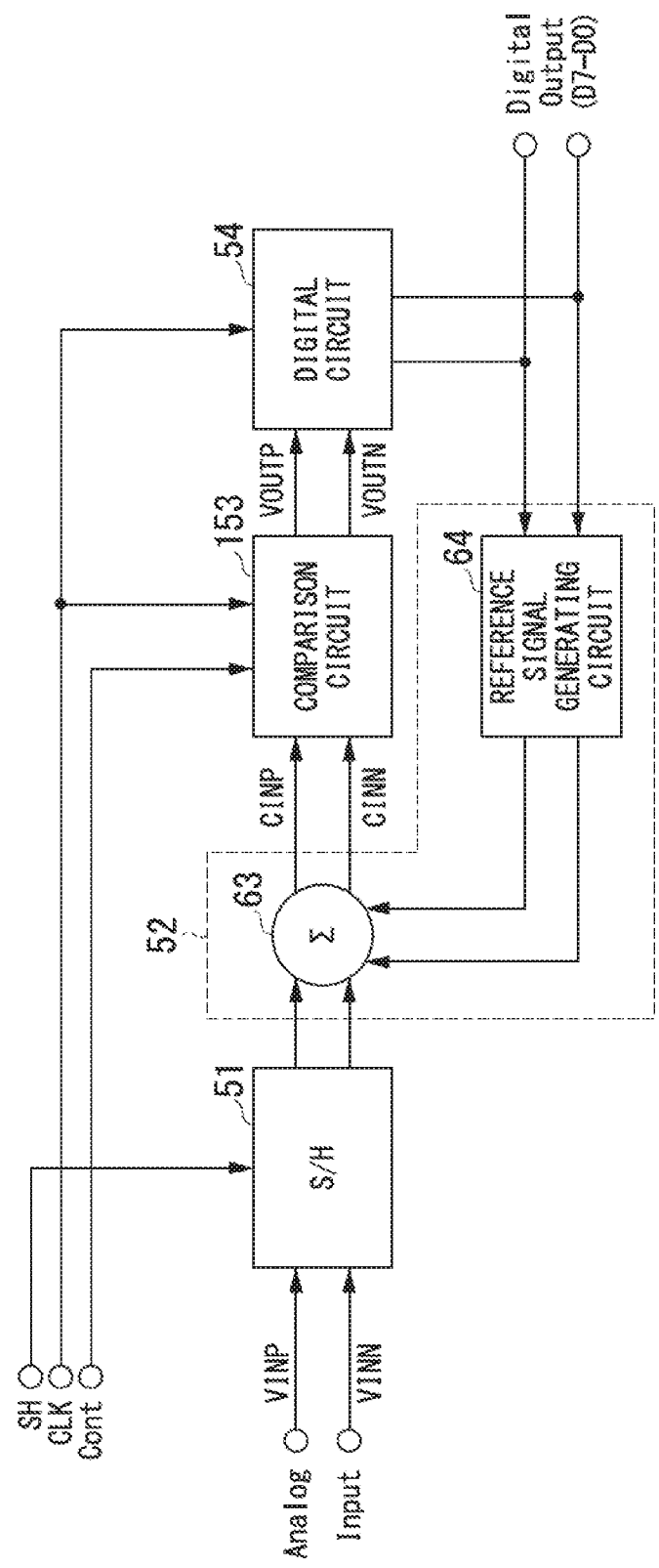
FIG. 9 is a block diagram illustrating a configuration example of a successive comparison A/D conversion circuit according to a reference aspect of the present invention.

FIG. 9 illustrates a configuration example of a successive comparison A/D conversion circuit 200 according to a reference aspect of the present invention. As illustrated in FIG. 9, the successive comparison A/D conversion circuit 200 includes a sample hold circuit 51, an arithmetic circuit 52, an comparison circuit 153, and a digital circuit 54.

The sample hold circuit 51 retains a signal VIN P and a signal VINN which are a pair of differential signals and outputs the retained signal VINP and signal VINN. The operation of the sample hold circuit 51 is controlled based on a control signal SH.

The arithmetic circuit 52 generates a reference signal based on a digital signal which is generated by the digital circuit 54, and subtracts the reference signal from the signal VINP and the signal VINN which are output from the sample hold circuit 51. The arithmetic circuit 52 outputs a signal CINP and a signal CINN, which are a pair of differential signals, to the comparison circuit 153 as a subtraction result.

The comparison circuit 153 amplifies the signal CINP and the signal CINN, and outputs a signal VOUTP and a signal VOUTN indicating a result of approximating a voltage of the amplified signal. The operation of the comparison circuit 153 is controlled based on a control signal CLK and a control signal Cont.

The digital circuit 54 generates a digital signal corresponding to the signal VOUTP and the signal VOUTN which are results of comparison of the comparison circuit 153. The operation of the digital circuit 54 is controlled based on the control signal CLK.

The arithmetic circuit 52 includes a subtraction circuit 63 and a reference signal generating circuit 64. The subtraction circuit 63 outputs the signal CINP and the signal CINN which are a pair of differential signals (first differential signals) generated by subtracting the reference signal from the signal VINP and the signal VINN which are a pair of differential signals (third differential signals). The reference signal generating circuit 64 generates a reference signal based on a control signal which is the digital signal generated by the digital circuit 54.

The successive comparison A/D conversion circuit 200 obtains an A/D conversion result one bit by one bit in sequence from a bit of an upper position towards a bit of a lower position. The comparison circuit 153 compares voltages of the differential signals whenever subtraction is performed by the arithmetic circuit 52. An A/D conversion result of one bit is obtained whenever the comparison circuit 153 performs comparison one time.

Figure 2:
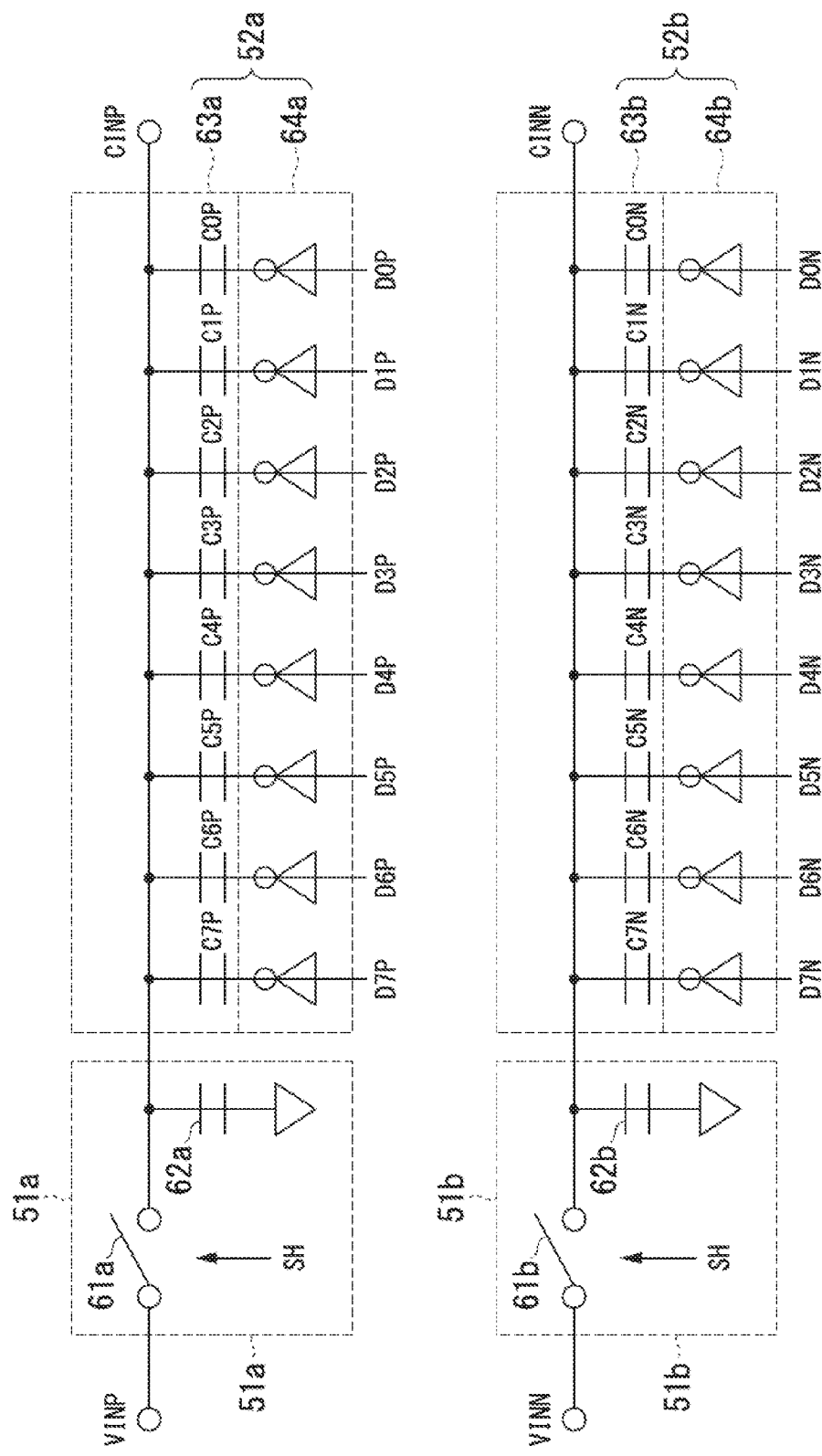
FIG. 2 is a circuit diagram illustrating a configuration example of a sample hold circuit and an arithmetic circuit which are included in the successive comparison A/D conversion circuit according to the first embodiment of the present invention.

FIG. 2 illustrates configuration examples of the sample hold circuit 51 and the arithmetic circuit 52. The configuration illustrated in FIG. 2 is common to the configuration of the sample hold circuit 51 and the arithmetic circuit 52 in embodiments of the present invention described below. A sample hold circuit 51a and a sample hold circuit 51b correspond to the sample hold circuit 51 illustrated in FIG. 9. In addition, the arithmetic circuit 52a and the arithmetic circuit 52b correspond to the arithmetic circuit 52 illustrated in FIG. 9.

The sample hold circuit 51a includes a switch 61a and a capacitance 62a. When the switch 61a is turned on, a first terminal and a second terminal are conducted, and when the switch 61a is turned off, the first terminal and the second terminal are in a high impedance state. The signal VINP is input into the first terminal of the switch 61a. When the switch 61a is turned on, the switch 61a samples the signal VINP. On and Off of the switch 61a are switched based on the control signal SH. A first terminal of the capacitance 62a is connected to the second terminal of the switch 61a. The second terminal of the capacitance 62a is connected to a predetermined voltage (for example, the lowest voltage). The capacitance 62a retains the signal VINP when the switch 61a is turned on.

The sample hold circuit 51b includes a switch 61b and a capacitance 62b. When the switch 61b is turned on, a first terminal and a second terminal are conducted, and when the switch 61b is turned off, the first terminal and the second terminal are in a high impedance state. The signal VINN is input into the first terminal of the switch 61b. When the switch 61b is turned on, the switch 61b samples the signal VINN. On and Off of the switch 61b are switched based on the control signal SH. A first terminal of the capacitance 62b is connected to the second terminal of the switch 61b. A second terminal of the capacitance 62b is connected to a predetermined voltage (for example, the lowest voltage). The capacitance 62b retains the signal VINN when the switch 61b is turned on.

The arithmetic circuit 52a includes a subtraction circuit 63a and a reference signal generating circuit 64a. The arithmetic circuit 52b includes a subtraction circuit 63b and a reference signal generating circuit 64b. The subtraction circuit 63a and the subtraction circuit 63b correspond to the subtraction circuit 63 illustrated in FIG. 9. The reference signal generating circuit 64a and the reference signal generating circuit 64b correspond to the reference signal generating circuit 64 illustrated in FIG. 9.

The subtraction circuit 63a includes a plurality of capacitances C0P to C7P. The capacitances C0P to C7P are arranged corresponding to digital signals D0P to D7P generated by the digital circuit 54. First terminals of the capacitances C0P to C7P are connected to the first terminal of the capacitance 62a. Capacitance values of the capacitances C0P to C7P are different from each other. For example, a capacitance value of a capacitance C(n+1)P corresponding to a digital signal D(n+1)P is two times a capacitance value of a capacitance CnP corresponding to a digital signal DnP (n is an integer from 0 to 6).

The reference signal generating circuit 64a includes a plurality of logic circuits. The logic circuits included in the reference signal generating circuit 64a are arranged corresponding to the digital signals D0P to D7P generated by the digital circuit 54. In an example illustrated in FIG. 2, the logic circuit is an inverter circuit. The digital signals D0P to D7P generated by the digital circuit 54 are input into an input terminal of the corresponding logic circuit. An output terminal of the logic circuit is connected to a second terminal of the corresponding capacitance of the capacitances C0P to C7P included in the subtraction circuit 63a.

The plurality of logic circuits included in the reference signal generating circuit 64a generate reference signals by inverting the digital signals D0P to D7P. The plurality of capacitances C0P to C7P included in the subtraction circuit 63a subtract the reference signal from the signal VINP by extracting a charge based on the reference signal from a charge based on the signal VINP retained in the capacitance 62a. The subtraction circuit 63a outputs the signal CINP which is a subtraction result.

The subtraction circuit 63b includes a plurality of capacitances C0N to C7N. The capacitances C0N to C7N are arranged corresponding to digital signals D0N to D7N generated by the digital circuit 54. First terminal of the capacitances C0N to C7N are connected to the first terminal of the capacitance 62b. Capacitance values of the respective capacitances C0N to C7N are different from each other. For example, the capacitance value of a capacitance C(n+1)N corresponding to a digital signal D(n+1)N is two times the capacitance value of a capacitance CnN corresponding to a digital signal DnN (n is an integer from 0 to 6).

The reference signal generating circuit 64b includes a plurality of logic circuits. The logic circuits included in the reference signal generating circuit 64b are arranged corresponding to the digital signals D0N to D7N generated by the digital circuit 54. In the example illustrated in FIG. 2, the logic circuit is an inverter circuit. The digital signals D0N to D7N generated by the digital circuit 54 are input into an input terminal of the corresponding logic circuit. An output terminal of the logic circuit is connected to a second terminal of the corresponding capacitance of the capacitances C0N to C7N included in the subtraction circuit 63b.

The plurality of logic circuits included in the reference signal generating circuit 64b generate reference signals by inverting the digital signals D0N to D7N. The plurality of capacitances C0N to C7N included in the subtraction circuit 63b subtract the reference signal from the signal VINN by extracting a charge based on the reference signal from a charge based on the signal VINN retained in the capacitance 62b. The subtraction circuit 63b outputs signal CINN which is a subtraction result.

According to the configuration described above, the subtraction circuit 63a and the subtraction circuit 63b subtract the reference signal from a signal having a larger voltage of the signal VINP and the signal VINN. The subtraction circuit 63a retains signal CINP which is the subtraction result and outputs the signal CINP. The subtraction circuit 63b retains the signal CINN which is the subtraction result and outputs the signal CINN. In a case where the subtraction is repeated, the subtraction circuit 63a and the subtraction circuit 63b subtract the reference signal from a signal having a larger voltage of the retained signal CINP and signal CINN.

The number of bits generated by the digital circuit 54 may be greater than or equal to 2 bits. The number of capacitances and logic circuits in the arithmetic circuit 52a and the arithmetic circuit 52b is set according to the number of bits of the digital signal generated by the digital circuit 54.

Figure 10:
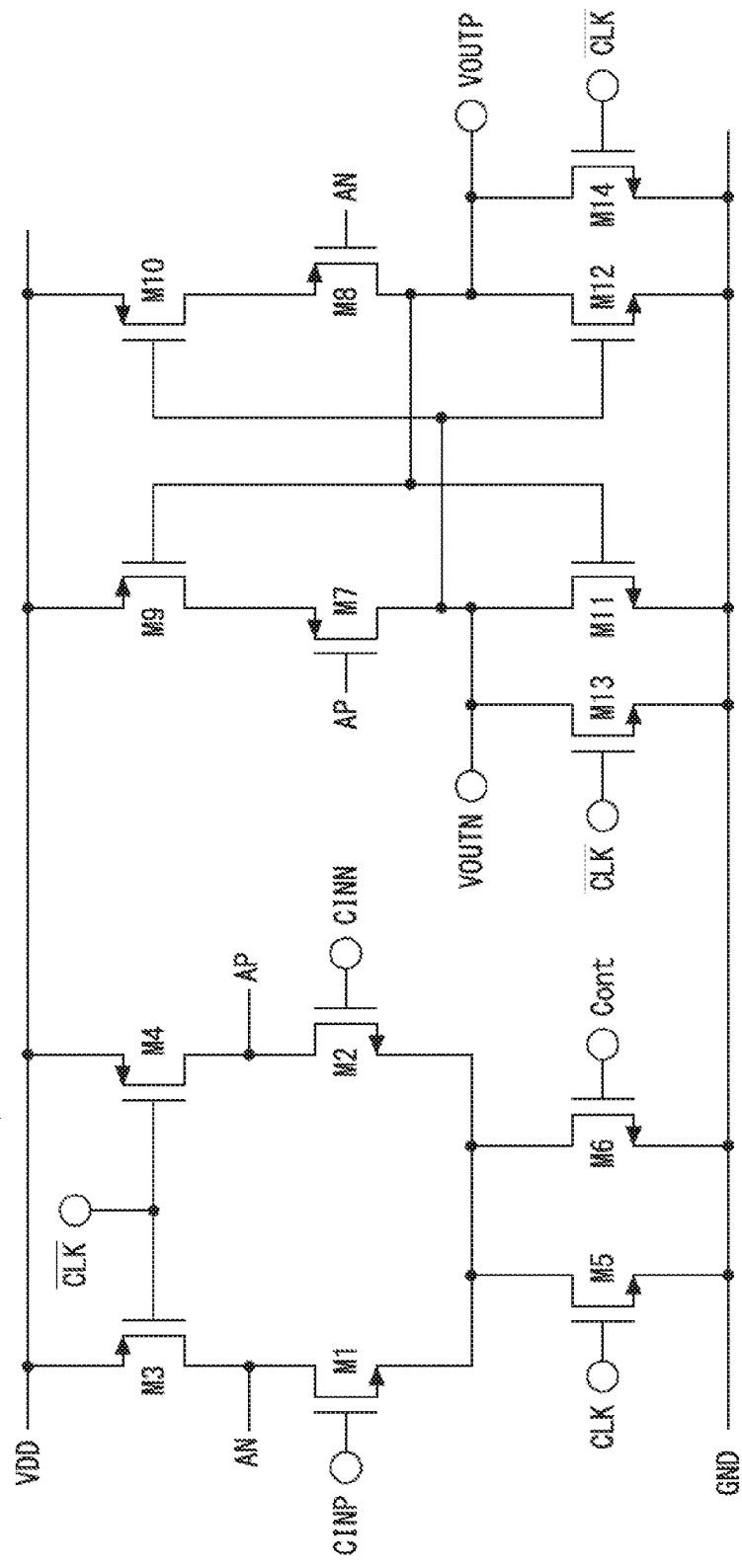
FIG. 10 is a circuit diagram illustrating a configuration example of an comparison circuit which is included in the successive comparison A/D conversion circuit according to the reference aspect of the present invention.

FIG. 10 illustrates a configuration example of the comparison circuit 153. As illustrated in FIG. 10, the comparison circuit 153 includes a differential amplification circuit 171 and a latch circuit 72.

The differential amplification circuit 171 includes a transistor M1, a transistor M2, a transistor M3, a transistor M4, a transistor M5, and a transistor M6. The transistor M1, the transistor M2, the transistor M5, and the transistor M6 are N type transistors. In addition, the transistor M3 and the transistor M4 are P type transistors.

A gate terminal of the transistor M1 is connected to a first input terminal. A gate terminal of the transistor M2 is connected to a second input terminal. The first input terminal and the second input terminal are differential input terminals into which the signal CINP and the signal CINN which are the pair of differential signals (the first differential signals) are input. The signal CINP is input into the first input terminal. The signal CINN is input into the second input terminal.

A source terminal of the transistor M3 is connected to a power supply voltage VDD. A drain terminal of the transistor M3 is connected to a drain terminal of the transistor M1. A source terminal of the transistor M4 is connected to the power supply voltage VDD. A drain terminal of the transistor M4 is connected to a drain terminal of the transistor M2. A gate terminal of the transistor M4 is connected to a gate terminal of the transistor M3. A signal in which the control signal CLK is inverted is input into the gate terminal of the transistor M3 and the gate terminal of the transistor M4.

A source terminal of the transistor M5 is connected to a lowest voltage GND. A drain terminal of the transistor M5 is connected to a source terminal of the transistor M1 and a source terminal of the transistor M2. The control signal CLK is input into a gate terminal of the transistor M5. A source terminal of the transistor M6 is connected to the lowest voltage GND. A drain terminal of the transistor M6 is connected to a source terminal of the transistor M1 and a source terminal of the transistor M2. The control signal Cont is input into a gate terminal of the transistor M6.

A signal AN in which the signal CINP is amplified is output from a drain terminal of the transistor M1. In addition, a signal AP in which the signal CINN is amplified is output from the drain terminal of the transistor M2. That is, the signal AP and the signal AN which are the pair of differential signals (the second differential signals) are output from the differential amplification circuit 171.

The latch circuit 72 includes a transistor M7, a transistor M8, a transistor M9, a transistor M10, a transistor M11, a transistor M12, a transistor M13, and a transistor M14. The transistor M11, the transistor M12, the transistor M13, and the transistor M14 are N type transistors. The transistor M7, the transistor M8, the transistor M9, and the transistor M10 are P type transistors.

A gate terminal of the transistor M7 is connected to the drain terminal of the transistor M2. The signal AP output from the differential amplification circuit 171 is input into the gate terminal of the transistor M7. A gate terminal of the transistor M8 is connected to the drain terminal of the transistor M1. The signal AN output from the differential amplification circuit 171 is input into the gate terminal of the transistor M8.

A source terminal of the transistor M9 is connected to the power supply voltage VDD. A drain terminal of the transistor M9 is connected to a source terminal of the transistor M7. A source terminal of the transistor M10 is connected to the power supply voltage VDD. A drain terminal of the transistor M10 is connected to a source terminal of the transistor M8.

A source terminal of the transistor M11 is connected to the lowest voltage GND. A drain terminal of the transistor M11 is connected to a drain terminal of the transistor M7. A gate terminal of the transistor M11 is connected to a gate terminal of the transistor M9 and a drain terminal of the transistor M8. A source terminal of the transistor M12 is connected to the lowest voltage GND. A drain terminal of the transistor M12 is connected to the drain terminal of the transistor M8. A gate terminal of the transistor M12 is connected to a gate terminal of the transistor M10 and the drain terminal of the transistor M7.

A source terminal of the transistor M13 is connected to the lowest voltage GND. A drain terminal of the transistor M13 is connected to the drain terminal of the transistor M11. A signal in which the control signal CLK is inverted is input into a gate terminal of the transistor M13. A source terminal of the transistor M14 is connected to the lowest voltage GND. A drain terminal of the transistor M14 is connected to the drain terminal of the transistor M12. The signal in which the control signal CLK is inverted is input into a gate terminal of the transistor M14.

The drain terminal of the transistor M14 is connected to the first output terminal. In addition, the drain terminal of the transistor M13 is connected to the second output terminal. The first output terminal and the second output terminal are terminals which output the signal VOUTP and the signal VOUTN indicating a result of approximating a voltage of the signal AP and a voltage of the signal AN. The signal VOUTP is output from the first output terminal. In addition, the signal VOUTN is output from the second output terminal.

In a case where the voltage of the signal AP is larger than the voltage of the signal AN, that is, in a case where a voltage of the signal CINP is larger than a voltage of the signal CINN, the signal VOUTP becomes High and the signal VOUTN becomes Low. In addition, in a case where the voltage of the signal AN is larger than the voltage of the signal AP, that is, in a case where the voltage of the signal CINN is larger than the voltage of the signal CINP, the signal VOUTN becomes High and the signal VOUTP becomes Low.

Next, an operation example which is the characteristics of the successive comparison A/D conversion circuit 200 will be described by using FIG. 11. FIG. 11 illustrates an operation example of the successive comparison A/D conversion circuit 200. In FIG. 11, the control signal SH, the control signal CLK, the control signal Cont, the signal VINP, the signal VINN, the signal CINP, the signal CINN, the signal VOUTP, and the signal VOUTN are illustrated. A horizontal direction in FIG. 11 indicates a time, and a vertical direction in FIG. 11 indicates a voltage.

As illustrated in FIG. 11, an operation in one sampling period of the successive comparison A/D conversion circuit 200 is divided into operations in each of periods T1 to T9. In each of the periods T1 to T8, a digital signal of one bit, which is an A/D conversion result, is obtained. In the periods T1 to T8, the digital signal is obtained one bit by one bit in sequence from the bit of the upper position towards the bit of the lower position.

The control signal SH is Low in the periods T1 to T8. In addition, the control signal SH is High in the period T9. The control signal CLK is Low in the first half of each of the periods T1 to T8, and becomes High in the last half. In addition, the control signal CLK is constantly Low in the period T9. The control signal Cont is Low in the periods T1 to T4 and the period T9. In addition, the control signal Cont is High in the periods T5 to T8.

In a period before the period T1, which is not illustrated, the control signal SH becomes High, and in the sample hold circuit 51*a* and the sample hold circuit 51*b*, the switch 61*a* and the switch 61*b* are turned on. At this time, the signal VINP is sampled by the switch 61*a* and is input into the capacitance 62*a* of the sample hold circuit 51*a* and the capacitances C0P to C7P included in the subtraction circuit 63*a* of the arithmetic circuit 52*a*. In addition, the signal VINN is sampled by the switch 61*b* and is input into the capacitance 62*b* of the sample hold circuit 51*b* and the capacitances C0N to C7N included in the subtraction circuit 63*b* of the arithmetic circuit 52*b*.

(Period T1)

The control signal SH becomes Low, and thus, in the sample hold circuit 51*a* and the sample hold circuit 51*b*, the switch 61.*a* and the switch 61*b* are turned off. The signal VINP is retained in the capacitance 62*a* of the sample hold circuit 51*a* and the capacitances C0P to C7P included in the subtraction circuit 63*a* of the arithmetic circuit 52*a*. The signal CINP based on the retained signal VINP is output to the comparison circuit 153. In addition, the signal VINN is retained in the capacitance 62*b* of the sample hold circuit 51*b* and the capacitances C0N to C7N included in the subtraction circuit 63*b* of the arithmetic circuit 52*b*. The signal CINN based on the retained signal VINN is output to the comparison circuit 153.

In the period T1, the digital signals D0P to D7P and the digital signals D0N to D7N are Low. For this reason, the reference signal which is input into the second terminal of the capacitances C0P to C7P included in the subtraction circuit 63*a* of the arithmetic circuit 52*a* becomes High. In addition, the reference signal which is input into the second terminal of the capacitances C0N to C7N included in the subtraction circuit 63*b* of the arithmetic circuit 52*b* becomes High. The first terminal of the capacitances C0P to C7P included in the subtraction circuit 63*a* of the arithmetic circuit 52*a* is charged with the voltage of the signal VINP. In addition, the first terminal of the capacitances C0N to C7N included in the subtraction circuit 63*b* of the arithmetic circuit 52*b* is charged with the voltage of the signal VINN. That is, the voltage of the signal CINP is identical to the voltage of the signal VINP, and the voltage of the signal CINN is identical to the voltage of the signal VINN.

When the control signal CLK is switched from Low to High, in the comparison circuit 153, the transistor M5 of the differential amplification circuit 171 is switched from Off to On. Accordingly, the differential amplification circuit 171 amplifies the signal CINP output from the arithmetic circuit 52*a* and the signal CINN output from the arithmetic circuit 52*b* and outputs the amplified signal AP and signal AN to the latch circuit 72.

In addition, when the control signal CLK is switched from Low to High, the transistor M13 and the transistor M14 of the latch circuit 72 are switched to Off. The latch circuit 72 compares the signal AP and the signal AN which are amplified by the differential amplification circuit 171 and outputs the signal VOUTP and the signal VOUTN according to the comparison result to the digital circuit 54. In the period T1, the voltage of the signal CINP is larger than the voltage of the signal CINN, and thus, the signal VOUTP becomes High and the signal VOUTN becomes Low.

The digital circuit 54 generates the digital signals D0P to D7P and the digital signals D0N to D7N based on the signal VOUTP and the signal VOUTN which are output from the comparison circuit 153. In the period T1, the digital circuit 54 sets a digital signal D7P to be High, sets a digital signal D7N to be Low, and sets digital signals D0P to D6P and digital signals D0N to D6N to be Low.

The digital circuit 54 outputs the digital signals D0P to D7P to the reference signal generating circuit 64*a* of the arithmetic circuit 52*a*. In addition, the digital circuit 54 outputs the digital signals D0N to D7N to the reference signal generating circuit 64*b* of the arithmetic circuit 52*b*.

The reference signal generating circuit 64*a* of the arithmetic circuit 52*a* generates a reference signal based on the digital signals D0P to D7P which are output from the digital circuit 54. In addition, the reference signal generating circuit 64*b* of the arithmetic circuit 52*b* generates a reference signal based on the digital signals D0N to D7N which are output from the digital circuit 54.

The digital signal D7P is High, and thus, the reference signal which is input into the second terminal of the capacitance C7P included in the subtraction circuit 63*a* of the arithmetic circuit 52*a* becomes Low. For this reason, the capacitance C7P subtracts the reference signal from the signal VINP by extracting a charge based on the reference signal from a charge based on the signal VINP which is retained in the capacitance 62*a* of the sample hold circuit 51*a*. At a time point where the period T1 ends, the voltage of the signal CINP becomes smaller than the voltage of the period T1. The voltage of the signal CINN is not changed. In addition, the digital circuit 54 outputs the signal VOUTP according to the comparison result as a digital signal D7 which is the A/D conversion result of the successive comparison A/D conversion circuit 200. The digital signal D7 is a signal of the most significant bit (the first bit) in the A/D conversion result.

(Period T2)

The control signal SH is Low, and thus, in the sample hold circuit 51a and the sample hold circuit 51b, the switch 61a and the switch 61b are turned off. As described above, the signal CINP and the signal CINN after the subtraction is performed are output to the comparison circuit 153.

At a time point where the period T1 ends, the control signal CLK is switched from High to Low, and thus, in the comparison circuit 153, the transistor M5 of the differential amplification circuit 171 is switched from On to Off. In addition, the transistor M13 and the transistor M14 of the latch circuit 72 are switched to On. For this reason, the signal VOUTP and the signal VOUTN according to the comparison result become Low.

When the control signal CLK is switched from Low to High, in the comparison circuit 153, the transistor M5 of the differential amplification circuit 171 is switched from Off to On. Accordingly, the differential amplification circuit 171 amplifies the signal CINP output from the arithmetic circuit 52a and the signal CINN output from the arithmetic circuit 52b and outputs the amplified signal AP and signal AN to the latch circuit 72.

In addition, when the control signal CLK is switched from Low to High, the transistor M13 and the transistor M14 of the latch circuit 72 are switched to Off. The latch circuit 72 compares the signal AP and the signal AN which are amplified by the differential amplification circuit 171 and outputs the signal VOUTP and the signal VOUTN according to the comparison result to the digital circuit 54. In the period T2, the voltage of the signal CINN is larger than the voltage of the signal CINP, and thus, the signal VOUTN becomes High and the signal VOUTP becomes Low.

The digital circuit 54 generates the digital signals D0P to D7P and the digital signals D0N to D7N based on the signal VOUTP and the signal VOUTN which are output from the comparison circuit 153. In the period T2, the digital circuit 54 sets a digital signal D6N to be High, sets a digital signal D6P to be Low and sets digital signals D0P to D5P and digital signals D0N to D5N to be Low. In addition, the digital circuit 54 retains the digital signal D7P and the digital signal D7N to be in a state which is set in the period T1. That is, the digital circuit 54 retains the digital signal D7P to be High, and retains the digital signal D7N to be Low.

The digital circuit 54 outputs the digital signals D0P to D7P to the reference signal generating circuit 64a of the arithmetic circuit 52a. In addition, the digital circuit 54 outputs the digital signals D0N to D7N to the reference signal generating circuit 64b of the arithmetic circuit 52b.

The reference signal generating circuit 64a of the arithmetic circuit 52a generates a reference signal based on the digital signals D0P to D7P which are output from the digital circuit 54. In addition, the reference signal generating circuit 64b of the arithmetic circuit 52b generates a reference signal based on the digital signals D0N to D7N which are output from the digital circuit 54.

The digital signal D6N is High, and thus, the reference signal which is input into the second terminal of the capacitance C6N included in the subtraction circuit 63b of the arithmetic circuit 52b becomes Low. For this reason, the capacitance C6N subtracts the reference signal from the signal VINN by extracting a charge based on the reference signal from a charge based on the signal VINN which is retained in the capacitance 62b of the sample hold circuit 51b. At a time point where the period T2 ends, the voltage of the signal CINN becomes smaller than the voltage of the period T2. The voltage of the signal CINP is not changed. In addition, the digital circuit 54 outputs the signal VOUTP according to the comparison result as a digital signal D6 which is the A/D conversion result of the successive comparison A/D conversion circuit 200. The digital signal D6 is a signal of the second significant bit (the second bit) in the A/D conversion result.

(Period T3)

The operation of the period T3 is identical to the operation of the period T2. In the period T3, the voltage of the signal CINP is larger than the voltage of the signal CINN, and thus, the digital circuit 54 sets a digital signal D5P to be High, sets a digital signal D5N to be Low and sets digital signals D0P to D4P and digital signals D0N to D4N to be Low. Digital signals D6P and D7P and digital signals D6N and D7N are retained in a state which is set in the periods T1 and T2.

The digital signal D5P is High, and thus, the reference signal which is input into the second terminal of the capacitance C5P included in the subtraction circuit 63a of the arithmetic circuit 52a becomes Low. For this reason, the reference signal is subtracted from the retained signal CINP according to the operation of the capacitance C5P. At a time point where the period T3 ends, the voltage of the signal CINP becomes smaller than the voltage of the period T3. The voltage of the signal CINN is not changed. In addition, the digital circuit 54 outputs the signal VOUTP according to the comparison result as a digital signal D5 which is the A/D conversion result of the successive comparison A/D conversion circuit 200. The digital signal D5 is a signal of the third significant (the third bit) in the A/D conversion result.

(Period T4)

The operation of the period T4 is identical to the operation of the period T2. In the period T4, the voltage of the signal CINN is larger than the voltage of the signal CINP, and thus, the digital circuit 54 sets a digital signal D4N to be High, sets a digital signal D4P to be Low, and sets digital signals D0P to D3P and digital signals D0N to D3N to be Low. Digital signals D5P to D7P and digital signals D5N to D7N are retained in a state which is set in the periods T1 to T3.

The digital signal D4N is High, and thus, the reference signal which is input into the second terminal of the capacitance C4N included in the subtraction circuit 63b of the arithmetic circuit 52b becomes Low. For this reason, the reference signal is subtracted from the retained signal CINN according to the operation of the capacitance C4N. At a time point where the period T4 ends, the voltage of the signal CINN becomes smaller than the voltage of the period T4. The voltage of the signal CINP is not changed. In addition, the digital circuit 54 outputs the signal VOUTP according to the comparison result as a digital signal D4 which is the A/D conversion result of the successive comparison A/D conversion circuit 200. The digital signal D4 is a signal of the fourth significant bit (the fourth bit) in the A/D conversion result.

(Period T5)

In general, a difference between the voltage of the signal CINP and the voltage of the signal CINN decreases as time passed and the number of times of comparison increases. For this reason, the last half the period, in particular, in the periods T5 to T8, it is desirable that the signal CINP and the signal CINN are more effectively amplified by the differential amplification circuit 171.

In the period T5, the control signal Cont is switched from Low to High, and thus, the transistor M6 of the differential amplification circuit 171 is turned on. For this reason, current supplied to the transistors M1 to M4 of the differential amplification circuit 171 increases. According to the increase in the current, an influence of noise with respect to a signal which is amplified by the differential amplification circuit 171 can be reduced. A period in which the control signal Cont is switched from Low to High (in this example, the period T5) is set in advance.

In the period T5, operations other than the operations described above are identical to the operation of the period T2. In period T5, the voltage of the signal CINP is larger than the voltage of the signal CINN, and thus, the digital circuit 54 sets a digital signal D3P to be High, sets a digital signal D3N to be Low, and sets digital signals D0P to D2P and digital signals D0N to D2N to be Low. Digital signals D4P to D7P and digital signals D4N to D7N are retained in a state which is set in the periods T1 to T4.

The digital signal D3P is High, and thus, the reference signal which is input into the second terminal of the capacitance C3P included in the subtraction circuit 63a of the arithmetic circuit 52a becomes Low. For this reason, the reference signal is subtracted from the retained signal CINP according to the operation of the capacitance C3P. At a time point where the period T5 ends, the voltage of the signal CINP becomes smaller than the voltage of the period T5. The voltage of the signal CINN is not changed. In addition, the digital circuit 54 outputs the signal VOUTP according to the comparison result as a digital signal D3 which is the A/D conversion result of the successive comparison A/D conversion circuit 200. The digital signal D3 is a signal of the fifth significant bit (the fifth bit) in the A/D conversion result.

(Periods T6 to T8)

The operation of the periods T6 to T8 is identical to the operation described above. In the period T6, a digital signal D2 which is a signal of the sixth significant bit is output in the A/D conversion result. In the period T7, a digital signal D1 which is a signal of the seventh significant bit is output in the A/D conversion result. In the period T8, a digital signal D0 which is a signal of the least significant bit is output in the A/D conversion result.

(Period T9)

In the period T9, the control signal SH is switched from Low to High, and thus, in the sample hold circuit 51a and the sample hold circuit 51b, the switch 61a and the switch 61b are turned on. In addition, the control signal CLK and the control signal Cont become Low, and thus, in the comparison circuit 153, the transistor M5 and the transistor M6 of the differential amplification circuit 171 are turned off, and the comparison circuit 153 stops the operation.

In the operation illustrated in FIG. 11, digital signals D7 to D0 are respectively 1, 0, 1, 0, 1, 0, 1, and 0 in a sequence from an upper bit to a lower bit. 1 corresponds to High, and 0 corresponds to Low.

In a period T10, the next sampling period is initiated. The operation of the period T10 is identical to the operation of the period T1.

As illustrated in FIG. 11, in the successive comparison A/D conversion circuit 200, in a case where the number of times of comparison increases, a difference between the voltage of the signal CINP and the voltage of the signal CINN which are output from the arithmetic circuit 52 decreases. In this case, the differential amplification circuit 171 effectively amplifies the signal CINP and the signal CINN. However, in a case where the number of times of comparison decreases, the difference between the voltage signal CINP and the voltage of the signal CINN increases. In this case, effectiveness of amplifying the signal CINP and the signal CINN decreases. Even in this case, operating the differential amplification circuit 171 is redundant from the viewpoint of power consumption.

(First Embodiment)

Figure 1:
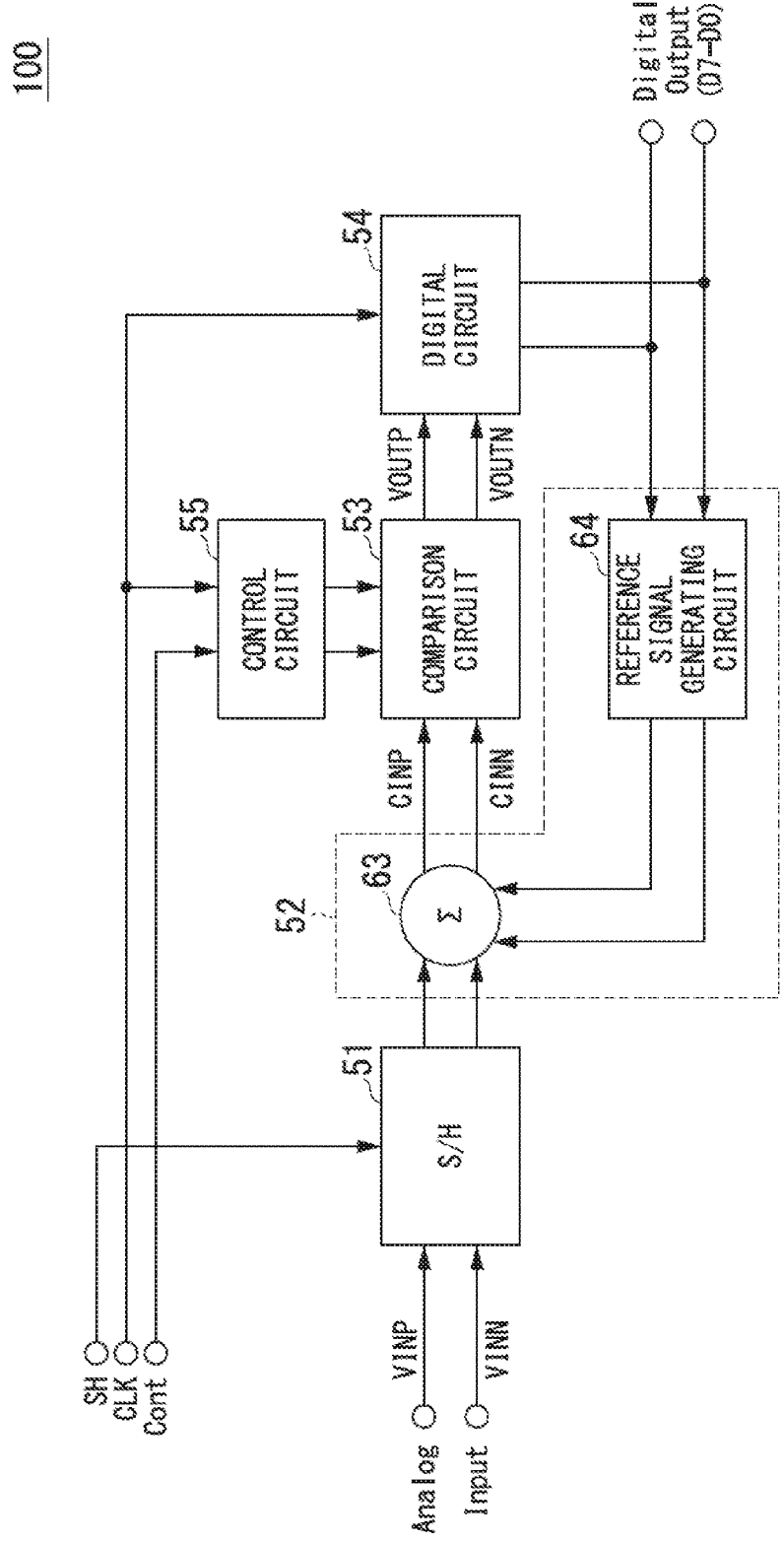
FIG. 1 is a block diagram illustrating a configuration of a successive comparison A/D conversion circuit according to a first embodiment of the present invention.

Next, a first embodiment of the present invention will be described. FIG. 1 illustrates a configuration example of a successive comparison A/D conversion circuit 100 according to this embodiment. As illustrated in FIG. 1, the successive comparison A/D conversion circuit 100 includes the sample hold circuit 51, the arithmetic circuit 52, an comparison circuit 53, the digital circuit 54, and a control circuit 55.

The sample hold circuit 51, the arithmetic circuit 52, and the digital circuit 54 are described above, and thus, the description thereof will be omitted. The comparison circuit 53 is a circuit in which part of the comparison circuit 153 illustrated in FIG. 9 is changed. The control circuit 55 controls the operation of the comparison circuit 53 based on the control signal CLK and the control signal Cont.

The successive comparison A/D conversion circuit 100 obtains an A/D conversion result one bit by one bit in sequence from a bit of an upper position towards a bit of a lower position. The comparison circuit 53 compares the voltages of the differential signals whenever subtraction is performed by the arithmetic circuit 52. An A/D conversion result of one bit is obtained whenever the comparison circuit 53 performs comparison one time.

Figure 3:
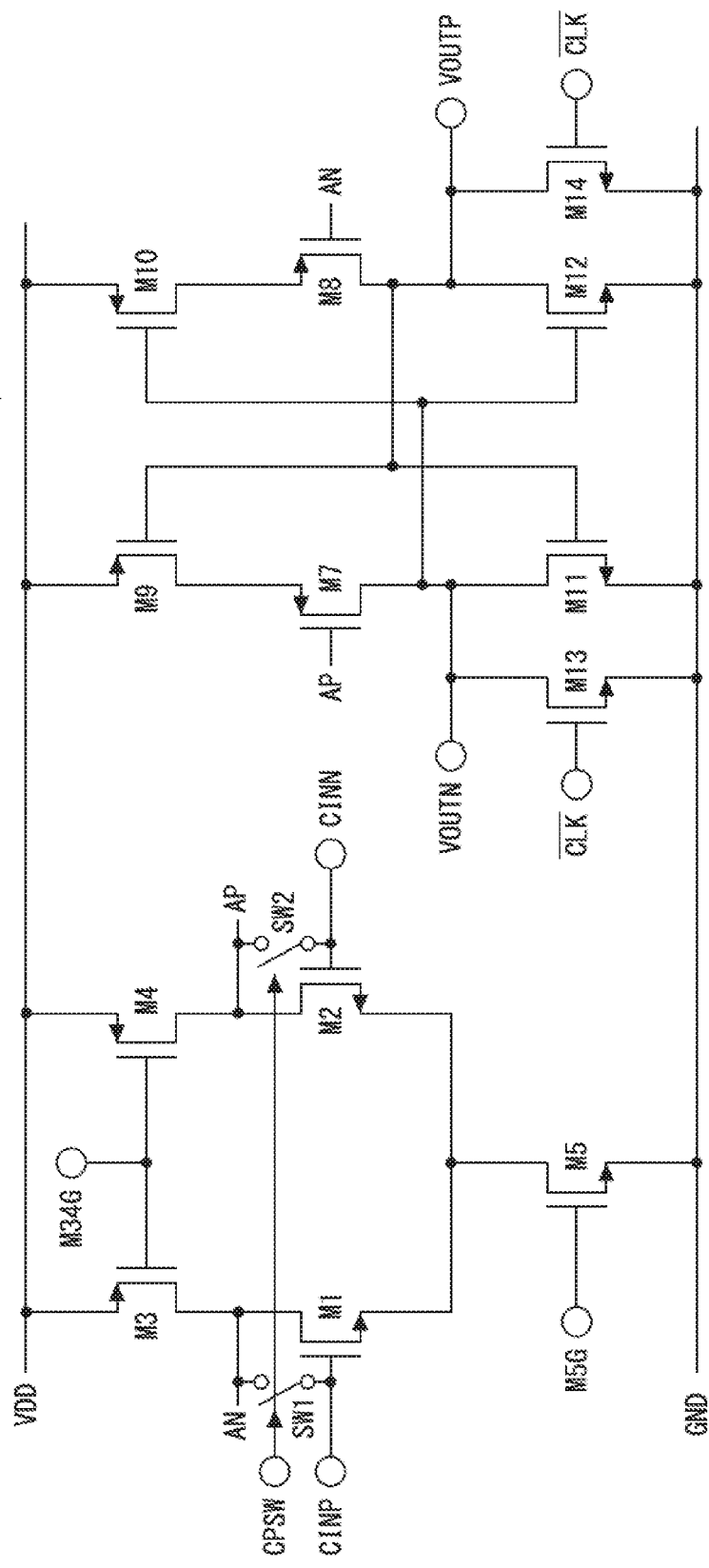
FIG. 3 is a circuit diagram illustrating a configuration example of an comparison circuit which is included in the successive comparison A/D conversion circuit according to the first embodiment of the present invention.

FIG. 3 illustrates a configuration example of the comparison circuit 53. As illustrated in FIG. 3, the comparison circuit 53 includes a differential amplification circuit 71 and the latch circuit 72.

The differential amplification circuit 71 includes the transistor M1, the transistor M2, the transistor M3, the transistor M4, the transistor M5, a switch SW1, and a switch SW2. Hereinafter, a difference from the differential amplification circuit 171 illustrated in FIG. 9 will be described.

In the differential amplification circuit 71, the transistor M6 included in the differential amplification circuit 171 is not disposed. A first terminal of the switch SW1 is connected to the gate terminal of the transistor M1. A second terminal of the switch SW1 is connected to the drain terminal of the transistor M1. When the switch SW1 is turned on, the first terminal and the second terminal are conducted, and when the switch SW1 is turned off the first terminal and the second terminal are in a high impedance state. On and Off of the switch SW1 are switched on basis of a control signal CPSW output from the control circuit 55.

A first terminal of the switch SW2 is connected to the gate terminal of the transistor M2. A second terminal of the switch SW2 is connected to the drain terminal of the transistor M2. When the switch SW2 is turned on, the first terminal and the second terminal are conducted, and when the switch SW2 is turned off, the first terminal and the second terminal are in a high impedance state. On and Off of the switch SW2 are switched based on the control signal CPSW output from the control circuit 55.

A control signal M34G output from the control circuit 55 is input into the gate terminal of the transistor M3 and the gate terminal of the transistor M4. In addition, a control signal M5G output from the control circuit 55 is input into the gate terminal of the transistor M5.

According to the configuration illustrated in FIG. 3, the differential amplification circuit 71 amplifies the signal CINP and the signal CINN which are the pair of differential signals input into the pair of differential input terminals, and outputs the signal AP and the signal AN which are the pair of differential signals.

The latch circuit 72 is described above, and thus, the description thereof will be omitted. According to the configuration illustrated in FIG. 3, the latch circuit 72 compares the voltage of the signal AP and the voltage of the signal AN which are output from the differential amplification circuit 71, retains the comparison result (the signal VOUTP and the signal VOUTN), and outputs the retained comparison result.

Figure 4:
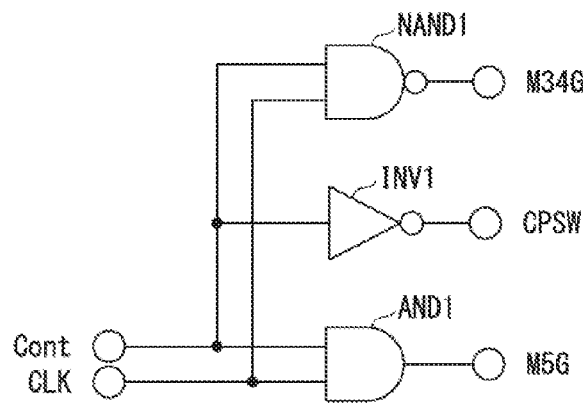
FIG. 4 is a circuit diagram illustrating a configuration example of a control circuit which is included in the successive comparison A/D conversion circuit according to the first embodiment of the present invention.

FIG. 4 illustrates a configuration example of the control circuit 55. As illustrated in FIG. 4, the control circuit 55 includes an NAND circuit NAND1, an inverter circuit INV1, and an AND circuit AND1.

The control signal Cont and the control signal CLK are input into the control circuit 55. The NAND circuit NAND1 performs an NAND operation with respect to the control signal Cont and the control signal CLK, and outputs the control signal M34G which is the result thereof. The control signal M34G is input into the gate terminal of the transistor M3 and the gate terminal of the transistor M4 which are included in the differential amplification circuit 71 of the comparison circuit 53.

The inverter circuit INV1 outputs the control signal CPSW in which the control signal Cont is inverted. The control signal CPSW is input into the switch SW1 and the switch SW2 which are included in the differential amplification circuit 71 of the comparison circuit 53. The AND circuit AND1 performs an AND operation with respect to the control signal Cont and the control signal CLK, and outputs the control signal M5G which is the result thereof. The control signal M5G is input into the gate terminal of the transistor M5 which is included in the differential amplification circuit 71 of the comparison circuit 53.

Figure 5:
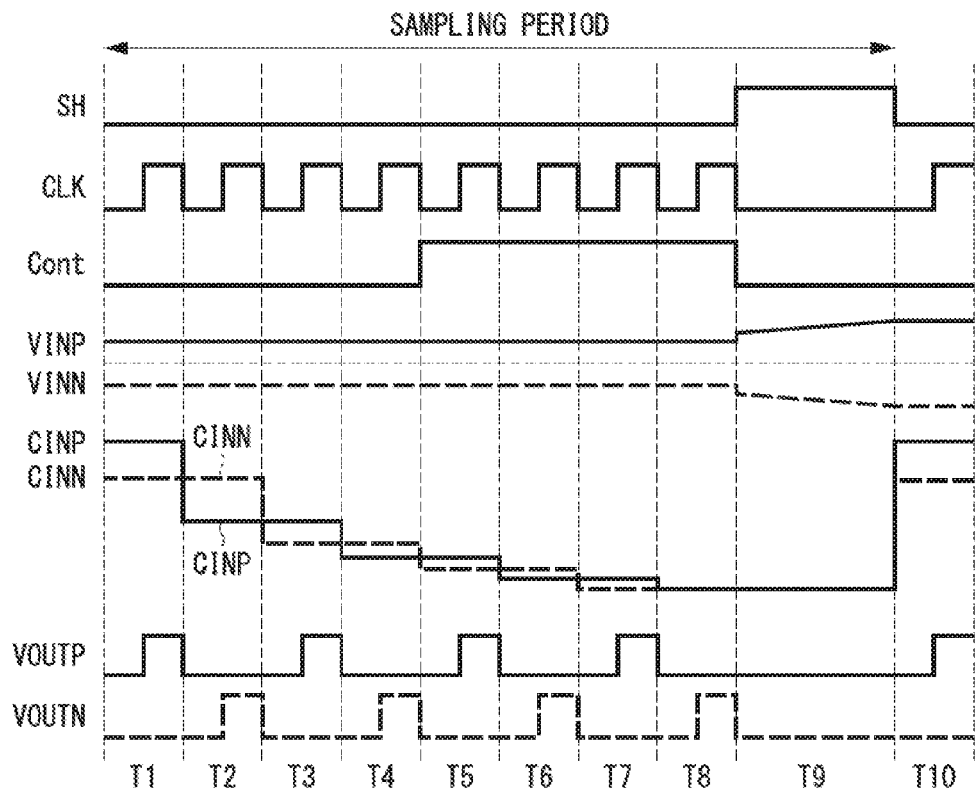
FIG. 5 is a timing chart illustrating an operation example of the successive comparison A/D conversion circuit according to the first embodiment of the present invention.

Next, an operation example which is the characteristics of the successive comparison A/D conversion circuit 100 will be described by using FIG. 5. FIG. 5 illustrates an operation example of the successive comparison A/D conversion circuit 100. In FIG. 5, the control signal SH, the control signal CLK, the control signal Cont, the signal VINP, the signal VINN, the signal CINP, the signal CINN, the signal VOUTP, and the signal VOUTN are illustrated. A horizontal direction of FIG. 5 indicates a time, and a vertical direction of FIG. 5 indicates a voltage.

Hereinafter, a difference from the operation illustrated in FIG. 11 will be described.

(Periods T1 to T4)

In periods T1 to T4, the control signal M34G is High, the control signal M5G is Low, and the control signal CPSW is High. The control signal M34G is High, and thus, the transistor M3 and the transistor M4 included in the differential amplification circuit 71 of the comparison circuit 53 are turned off. In addition, the control signal M5G is Low, and thus, the transistor M5 included in the differential amplification circuit 71 is turned off. Therefore, the differential amplification circuit 71 stops the operation.

The control signal CPSW is High, and thus, the switch SW1 and the switch SW2 included in the differential amplification circuit 71 are turned on. For this reason, the signal CINP input into the first input terminal of the differential amplification circuit 71 is output to latch circuit 72 as the signal AN. In addition, the signal CINN input into the second input terminal of the differential amplification circuit 71 is output to the latch circuit 72 as the signal AP.

That is, the control circuit 55 stops the operation of the differential amplification circuit 71 in a predetermined period (continuous periods T1 to T4) including a period T1 in which the comparison circuit 53 initiates comparison. In other words, the control circuit 55 stops the operation of the differential amplification circuit 71 in a period in which the number of times of comparison does not satisfy the number of times of comparison set in advance (in this example, five times). Further, in other words, the control circuit 55 stops the operation of the differential amplification circuit 71 in a predetermined period in which the A/D conversion result of the bit of the upper position is obtained, including a period T1 in which the comparison circuit 53 initiates comparison. The period T1 in which the comparison circuit 53 initiates comparison is a period in which the comparison circuit 53 obtains the A/I conversion result of the most significant bit. The period in which the differential amplification circuit 71 stops the operation (in this example, the periods T1 to T4) is set in advance.

(Periods T5 to T8)

In periods T5 to T8, the control signal CPSW is Low. For this reason, the switch SW1 and the switch SW2 included in the differential amplification circuit 71 are turned off.

In a case where the control signal CLK is Low, the control signal M34G is High, and the control signal M5G is Low. For this reason, the differential amplification circuit 71 stops the operation.

In a case where the control signal CLK is High, the control signal M34G is Low, and the control signal M5G is High. The control signal M34G is Low, and thus, the transistor M3 and the transistor M4 included in the differential amplification circuit 71 of the comparison circuit 53 are turned on. In addition, the control signal M5G is High, and thus, the transistor M5 included in the differential amplification circuit 71 is turned on. Therefore, the differential amplification circuit 71 performs an amplification operation.

That is, the control circuit 55 operates the differential amplification circuit 71 in a predetermined period (continuous periods T5 to T8) after the period in which the operation of the differential amplification circuit 71 is stopped. In other words, the control circuit 55 operates the differential amplification circuit 71 in a period in which the number of times of comparison is equal to or greater than the number of times of comparison (in this example, five times) set in advance. Further, in other words, the control circuit 55 operates the differential amplification circuit 71 in a predetermined period in which the A/D conversion result of the bit of the lower position is obtained, after the predetermined period in which the A/D conversion result of the bit of the upper position is obtained.

Operations other than the operation described above are described above, and thus, the description thereof will be omitted.

According to this embodiment, the successive comparison A/D conversion circuit 100 including the comparison circuit 53 including the differential amplification circuit 71 which amplifies the pair of first differential signals (the signal CINP and the signal CINN) input into the pair or differential input terminals and outputs the pair of second differential signals (the signal AP and the signal AN), the latch circuit 72 which compares the voltages of the second differential signals output from the differential amplification circuit 71, retains the comparison result, and outputs the retained comparison result, the digital circuit 54 which generates the digital signals (the digital signals D0P to D7P and the digital signals D0N to D7N) corresponding to the first differential signal based on the comparison result, the arithmetic circuit 52 which generates the reference signal based on the digital signal and outputs the first differential signal generated by subtracting the reference signal from the third differential signal (the signal VINP and the signal VINN) to the differential input terminal, and the control circuit 55 which stops the operation of the differential amplification circuit 71 in a predetermined period including a period in which the comparison circuit 53 initiates comparison is configured.

In this embodiment, the operation of the differential amplification circuit 71 is stopped in a predetermined period including a period in which the comparison circuit 53 initiates comparison, and thus, it is possible to further reduce power consumption.

(Modification Example)

Next, a modification example of this embodiment will be described. This modification example will be described by using the configuration of the successive comparison A/D conversion circuit 100 illustrated in FIG. 1. In this modification example, the subtraction circuit 63 of the arithmetic circuit 52 outputs the signal CINP and the signal CINN which are the pair of differential signals (the first differential signal) generated by adding the reference signal to the signal VINP and the signal VINN which are the pair of differential signals (the third differential signal).

Figure 6:
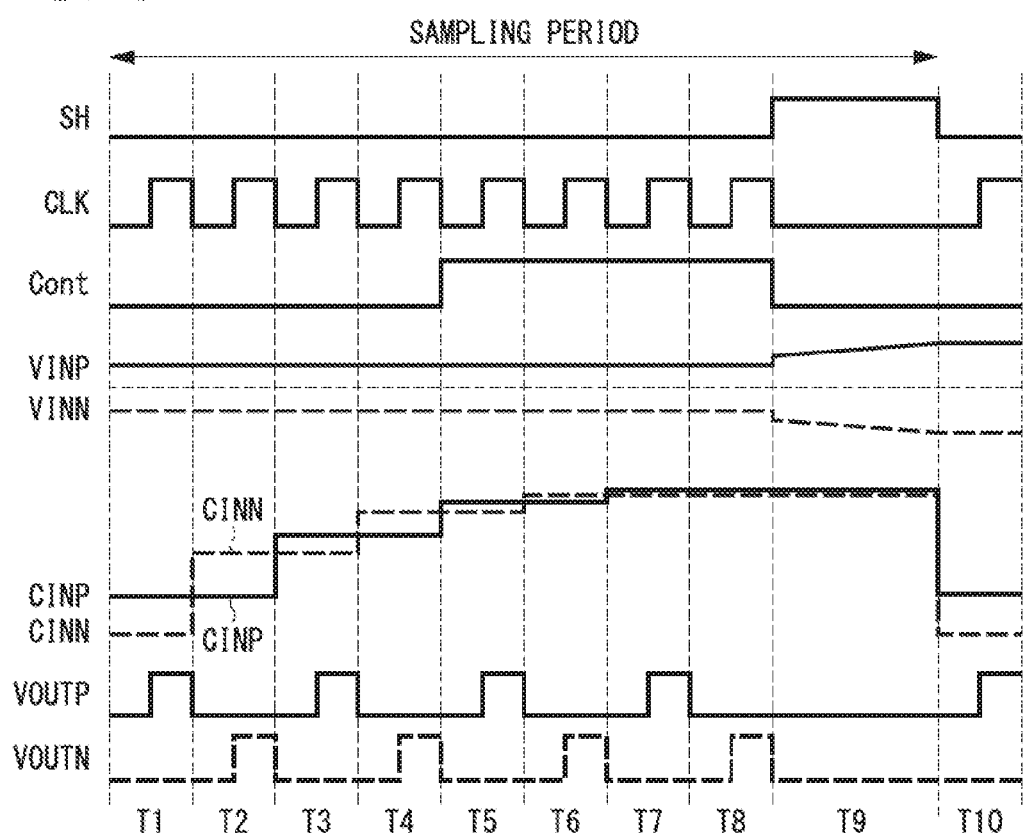
FIG. 6 is a timing chart illustrating an operation example of a successive comparison A/D conversion circuit according to a modification example of the first embodiment of the present invention.

FIG. 6 illustrates an operation example of the successive comparison A/D conversion circuit 100. In FIG. 6, the control signal SH, the control signal CLK, the control signal Cont, the signal VINP, the signal VINN, the signal CINP, the signal CINN, the signal VOUTP, and the signal VOUTN are illustrated. A horizontal direction of FIG. 6 indicates time, and a vertical direction of FIG. 6 indicates voltage.

Hereinafter, a difference from the operation illustrated in FIG. 5 will be described. In an operation illustrated in FIG. 6, the reference signal is added to a signal having a smaller voltage of the signal CINP and the signal CINN. For example, in a period T1, the voltage of the signal CINN is smaller than the voltage of the signal CINP. For this reason, the reference signal is added to the signal CINN. At a time point where the period T1 ends, the voltage of the signal CINN becomes larger than the voltage of the period T1.

In a period T2 following the period T1, the voltage of the signal CINP is smaller than the voltage of the signal CINN. For this reason, the reference signal is added to the signal CINP. At a time point where the period T2 ends, the voltage of the signal CINP becomes larger than the voltage of the period T2. In periods T3 to T8, the same operation as the operation described above is performed.

Operations other than the operation described above are described above, and thus, the description thereof will be omitted.

According to this modification example, the successive comparison A/D conversion circuit 100 including the comparison circuit 53 including the differential amplification circuit 71 which amplifies the pair of first differential signals (the signal CINP and the signal CINN) input into the pair of differential input terminals and outputs the pair of second differential signals (the signal AP and the signal AN), and the latch circuit 72 which compares the voltages of the second differential signals output from the differential amplification circuit 71, retains the comparison result, and outputs the retained comparison result, the digital circuit 54 which generates the digital signals (the digital signals D0P to D7P and the digital signals D0N to D7N) corresponding to the first differential signal based on the comparison result, the arithmetic circuit 52 which generates the reference signal based on the digital signal and outputs the first differential signal generated by adding the reference signal to the third differential signal (the signal VINP and the signal VINN) to the differential input terminal, and the control circuit 55 which stops the operation of the differential amplification circuit 71 in a predetermined period including a period in which the comparison circuit 53 initiates comparison is configured.

In this modification example, the operation of the differential amplification circuit 71 is stopped in a predetermined period including a period in which the comparison circuit 53 initiates comparison, and thus, it is possible to further reduce power consumption.

(Second Embodiment)

Figure 7:
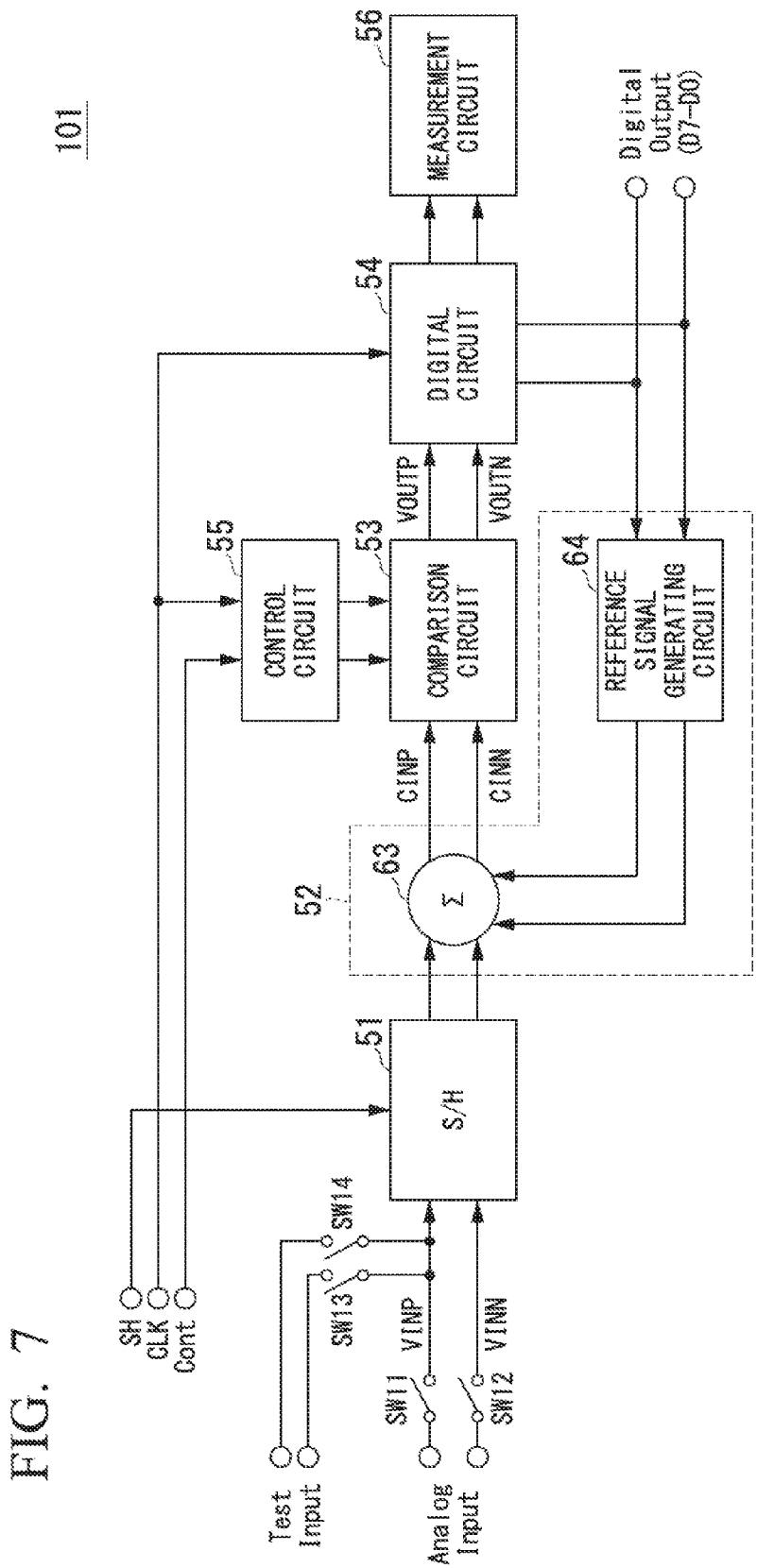
FIG. 7 is a block diagram illustrating a configuration of a successive comparison A/D conversion circuit according to a second embodiment of the present invention.

Next, a second embodiment of the present invention will be described. FIG. 7 illustrates a configuration example of a successive comparison A/D conversion circuit 101 according to this embodiment. As illustrated in FIG. 7, the successive comparison A/D conversion circuit 101 includes the sample hold circuit 51, the arithmetic circuit 52, the comparison circuit 53, the digital circuit 54, the control circuit 55, a measurement circuit 56, the switch SW11, the switch SW12, a switch SW13, and a switch SW14.

The sample hold circuit 51, the arithmetic circuit 52, the comparison circuit 53, the digital circuit 54, and the control circuit 55 are described above, and thus, the description thereof will be omitted. The measurement circuit 56 measures an offset voltage applied to the signal AP and the signal AN which are the second differential signals in the latch circuit 72 of the comparison circuit 53 based on the comparison result when a predetermined signal (a test signal) is input into the differential input terminal of the differential amplification circuit 71 of the comparison circuit 53 as the first differential signal.

In a case where the latch circuit 72 has the offset voltage, the offset voltage becomes a factor of an error at the time of approximating the voltage of the signal AP and the voltage of the signal AN. Specifically, the latch circuit 72 shifts the voltage of either the signal AP or the signal AN to an upper portion or a lower portion. Accordingly, an error occurs in the A/D conversion result.

The measurement circuit 56 determines a period in which the operation of the differential amplification circuit 71 is stopped based on the measurement result. The measurement circuit 56 controls the control signal Cont according to the determined period.

The control circuit 55 stops the operation of the differential amplification circuit 71 in a predetermined period which includes a period in which the comparison circuit 53 initiates comparison, according to the offset voltage measured by the measurement circuit 56. That is, a difference between the signal AP and the signal AN increases, and thus, in a period in which the influence of the offset voltage decreases, the control circuit 55 stops the operation of the differential amplification circuit 71. In a period in which the difference between the signal AP and the signal AN decreases and the influence of the offset voltage increases, the control circuit 55 operates the differential amplification circuit 71.

When the switch SW11, the switch SW12, the switch SW13, and the switch SW14 are turned on, the first terminal and the second terminal are conducted, and when the switch SW11, the switch SW12, the switch SW13, and the switch SW14 are turned off, the first terminal and the second terminal are in a high impedance state. The signal VINP is input into a first terminal of the switch SW11. The second terminal of the switch SW11 is connected to a first terminal of the switch 61*a* of the sample hold circuit 51*a*. The signal VINN is input into a first terminal of the switch SW12. A second terminal of the switch SW12 is connected to the first terminal of the switch 61*b* of the sample hold circuit 51*b*.

A first test signal is input into a first terminal of the switch SW13. A second terminal of the switch SW13 is connected to the first terminal of the switch 61*a* of the sample hold circuit 51*a*. A second test signal is input into a first terminal of the switch SW14. A second terminal of the switch SW14 is connected to the first terminal of the switch 61*b* of the sample hold circuit 51*b*.

The first test signal and the second test signal are known differential signals having different voltages. For example, the voltage of the first test signal and the second test signal is a voltage of a middle point in a range of an input voltage which is estimated in advance in the successive comparison A/D conversion circuit 101. An ideal A/D conversion result of the first test signal and the second test signal is known in advance. A difference between an actual A/D conversion result and the ideal A/D conversion result of the first test signal and the second test signal is calculated, and thus, the offset voltage of the latch circuit 72 can be obtained.

Figure 8:
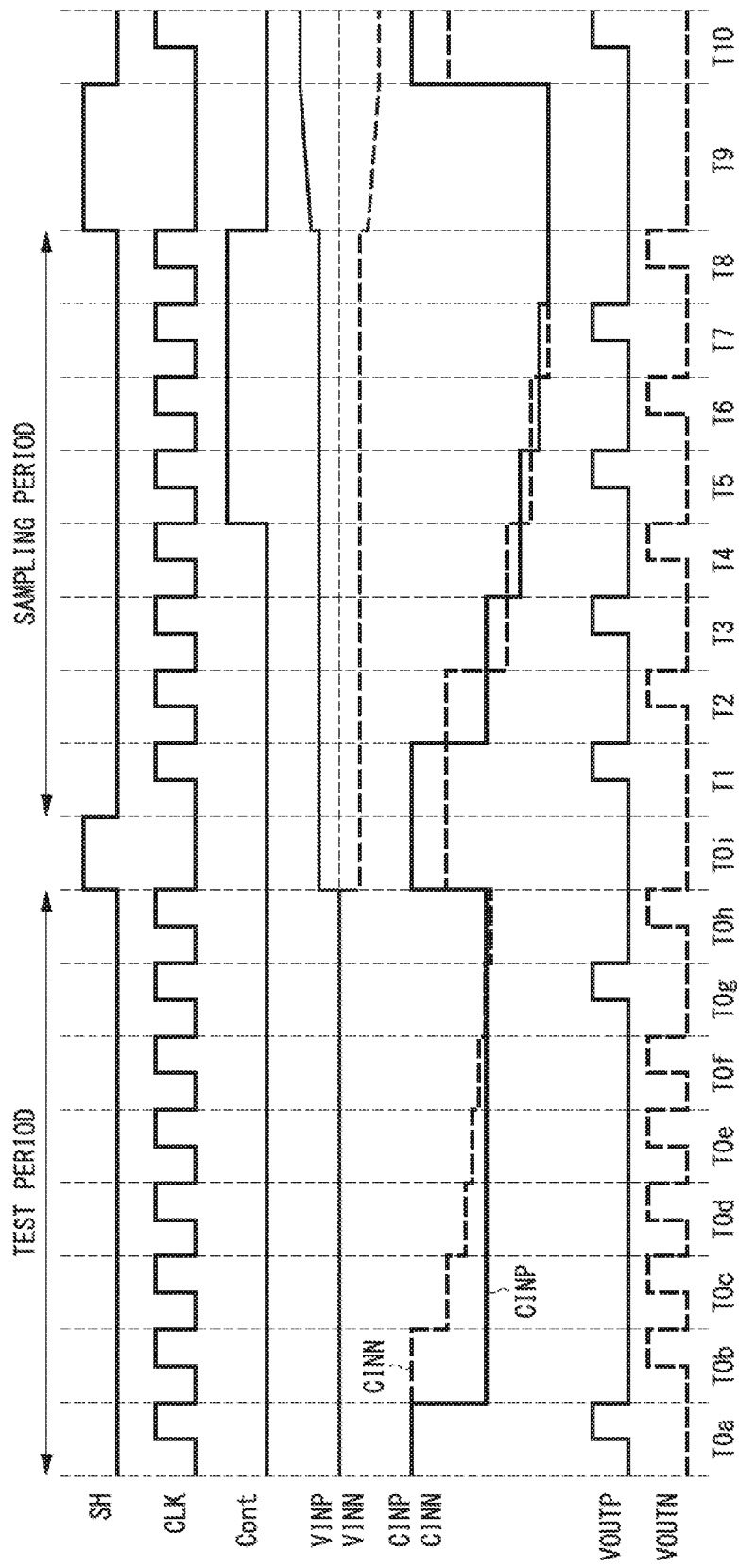
FIG. 8 is a timing chart illustrating an operation example of the successive comparison AD conversion circuit according to the second embodiment of the present invention.

FIG. 8 illustrates an operation example of the successive comparison A/D conversion circuit 101. In FIG. 8, the control signal SH, the control signal CLK, the control signal Cont, the signal VINP, the signal VINN, the signal CINP, the signal CINN, the signal VOLTP, and the signal VOUTN are illustrated. A horizontal direction of FIG. 8 indicates a time, and a vertical direction of FIG. 8 indicates a voltage.

Hereinafter, a difference from the operation illustrated in FIG. 5 will be described. As illustrated in FIG. 8, a test period is provided before a sampling period in which A/D conversion between the signal VINP and the signal VINN is performed. The test period is a period in which A/D conversion between the first test signal and the second test signal is performed.

As illustrated in FIG. 8, an operation in one test period of the successive comparison A/D conversion circuit 101 is divided into operations in each of periods T0*a* to T0*h*. The control signal SH is Low in the periods T0*a* to T0*h*. The control signal CLK is Low in the first half of each of the periods T0*a* to T0*h* and becomes High in the last half. The control signal Cont is Low in the periods T0*a* to T0*h*.

In the periods T0*a* to T0*h*, the switch SW11 and the switch SW12 are turned off. In addition, in the periods T0*a* to T0*h*, the switch SW13 and the switch SW14 are turned on. For this reason, the first test signal and the second test signal are input into the sample hold circuit 51. The same state applies to a period (not illustrated) before the period T0*a*.

In the period (not illustrated) before the period T0*a*, the control signal SH is High, and in the sample hold circuit 51*a* and the sample hold circuit 51*b*, the switch 61*a* and the switch 61*b* are turned on. At this time, the first test signal is sampled by the switch 61*a* and is input into the capacitance 62*a* of the sample hold circuit 51*a* and the capacitances C0P to C7P included in the subtraction circuit 63*a* of the arithmetic circuit 52*a*. In addition, the second test signal is sampled by the switch 61*b* and is input into the capacitance 62*b* of the sample hold circuit 51*b* and the capacitances C0N to C7N included in the subtraction circuit 63*b* of the arithmetic circuit 52*b*.

In the periods T0*a* to T0*h*, the control signal Cont is Low, and thus, the differential amplification circuit 71 of the comparison circuit 53 stops the operation. The operation of the periods T0*a* to T0*h* is identical to the operation of the periods T1 to T4 in which the differential amplification circuit 71 stops the operation in FIG. 5. The operation of the period T0*i* after the test period ends is identical to the operation of the period T9 in FIG. 5.

The digital circuit 54 outputs the digital signals D0 to D7 obtained in the test period to the measurement circuit 56. The digital signals D0 to D7 are the A/D conversion result between the first test signal and the second test signal. The measurement circuit 56 calculates a difference between the digital signals D0 to D7 and a digital signal corresponding to the ideal A/D conversion result, and thus, the offset voltage is obtained.

In the operation illustrated in FIG. 8, the digital signals D7 to D0 obtained in the test period are respectively 1, 0, 0, 0, 0, 0, 1, and 0 in a sequence from an upper bit to a lower bit. 1 corresponds to High, and 0 corresponds to Low. It is found that in a case where the digital signals corresponding to the ideal A/D conversion result are respectively 1, 0, 0, 0, 0, 0, 0, and 0 in a sequence from an upper bit to a lower bit, a digital signal D1 of the seventh bit indicates an offset voltage.

The measurement circuit 56 controls the control signal Cont such that the differential amplification circuit 71 of the comparison circuit 53 initiates the operation in a period in which A/D conversion of a bit upper than the most significant bit of the offset voltage denoted by the digital signal is performed. In the operation illustrated in FIG. 8, the most significant bit of the offset voltage is the seventh bit. For example, the control signal Cont is controlled such that the differential amplification circuit 71 initiates the operation in a period in which A/D conversion of a bit upper than the most significant bit of the offset voltage by two bits. Therefore, the control signal Cont is controlled such that the differential amplification circuit 71 initiates the operation in a period T5 in which A/D conversion of the fifth bit is performed.

In periods T1 to T9, the switch SW11 and the switch SW12 are turned on. In addition, in the periods T1 to T9, the switch SW13 and the switch SW14 are turned off. For this reason, the signal VINP and the signal VINN are input into the sample hold circuit 51.

As a result of the control of the measurement circuit 56, in the periods T1 to T4, the control signal Cont is Low, and in the periods T5 to T8, the control signal Cont is High. For this reason, in the periods T1 to T4, the differential amplification circuit 71 stops the operation. In addition, in the periods T5 to T8, the differential amplification circuit 71 performs an amplification operation.

The operation of the periods T1 to T9 is identical to the operation of the periods T1 to T9 in FIG. 5.

The offset voltage from the A/D conversion result obtained in the sampling period may be subtracted. For example, the measurement circuit 56 outputs the digital signal corresponding to the offset voltage calculated based on the A/D conversion result obtained in the test period to the digital circuit 54. In the periods T1 to T8, when the digital circuit 54 outputs the signal VOUTP as the digital signal, the voltage of the digital signal corresponding to the offset voltage is subtracted from the voltage of the signal VOUTP. That is, the digital circuit 54 subtracts the digital signal corresponding to the offset voltage from the digital signal corresponding to the signal CINP and the signal CINN. The digital circuit 54 outputs the subtracted digital signal as the A/D conversion result.

In this embodiment, a period in which the differential amplification circuit 71 is operated is controlled according to the offset voltage of the latch circuit 72. For this reason, it is possible to further reduce power consumption while reducing an influence of the offset voltage of the latch circuit 72 on the A/D conversion result.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description and is only limited by the scope of the appended claims.

What is claimed is:

1. A successive comparison A/D conversion circuit, comprising:
  a comparison circuit including a differential amplification circuit which includes a pair of differential input terminals, amplifies a pair of first differential signals input into the pair of differential input terminals, and outputs a pair of second differential signals, and a latch circuit which compares voltages of the second differential signals output from the differential amplification circuit, retains a comparison result, and outputs the retained comparison result;
  a digital circuit which generates a digital signal corresponding to the pair of first differential signals, based on the comparison result;
  an arithmetic circuit which generates a reference signal based on the digital signal, generates the pair of first differential signals by subtracting the reference signal from a third differential signal, or by adding the reference signal to the third differential signal, and outputs the generated pair of first differential signals to the pair of differential input terminals; and
  a control circuit which stops an operation of the differential amplification circuit in a predetermined period including a period in which the comparison circuit initiates comparison.

2. The successive comparison A/D conversion circuit according to claim 1,
  wherein the control circuit stops the operation of the differential amplification circuit in a period in which a number of times of comparison does not satisfy a predetermined number of times of comparison.

3. The successive comparison A/D conversion circuit according to claim 1, further comprising:
  a measurement circuit which measures an offset voltage applied to the pair of second differential signals in the latch circuit, based on the comparison result when a predetermined signal is input into the differential input terminal as the pair of first differential signals,
  wherein the control circuit stops the operation of the differential amplification circuit in a predetermined period, which includes a period in which the comparison circuit initiates comparison and is in accordance with the offset voltage measured by the measurement circuit.

* * * * *